United States Patent [19]

Löser et al.

[11] 4,342,284

[45] Aug. 3, 1982

[54] PROCESS FOR THE COATING OF PARTICLES FOR THE PRODUCTION OF FUEL AND/OR ABSORBING ELEMENTS FOR NUCLEAR REACTORS AND APPARATUS THEREFOR

[76] Inventors: Harald Löser, Selzerweg 34, 8756 Kahl; Gerhard Schmidt, Holzgasse 7, 6460 Gelnhausen; Wolfgang Warzawa, Wiesenstrasse 15, 6450 Hanau 9; Klaus Wegner, Hintergasse 10, 6450 Hanau 1, all of Fed. Rep. of Germany

[21] Appl. No.: 866,339

[22] Filed: Jan. 3, 1978

Related U.S. Application Data

[62] Division of Ser. No. 805,452, Jun. 10, 1977, Pat. No. 4,271,207.

[30] Foreign Application Priority Data

Jun. 12, 1976 [DE] Fed. Rep. of Germany ....... 2626446

[51] Int. Cl.³ .............................................. C23C 11/10
[52] U.S. Cl. .................................................. 118/716
[58] Field of Search .................. 118/DIG. 6, 303, 48, 118/716; 105/104 F; 427/213, 6; 176/915 P

[56] References Cited

U.S. PATENT DOCUMENTS 3,398,718 8/1968 Pilloton ................................ 118/48
3,566,830 1/1978 Flamm ................................. 118/48

FOREIGN PATENT DOCUMENTS 2102438 8/1972 Fed. Rep. of Germany .......... 427/6

Primary Examiner—Sam Silverberg
Attorney, Agent, or Firm—Cushman, Darby & Cushman

[57] ABSTRACT

Fuel, fertile material and/or absorber material containing particles for fuel and/or absorber elements in nuclear reactors are coated by a process comprising introducing thermally cleavable gases in the reaction space heated to above 1000° C. of a fluidized bed unit with the help of a gas inlet nozzle cooled with a cooling medium and having an elongated inlet tube, decomposing the cleavable gases after leaving the nozzle, depositing the decomposition products on fuel, fertile material or absorber particles present in the fluidized bed and bringing these coated particles into fuel elements or absorber elements. The cooling medium is solely gaseous and only the portion of the inlet tube for the nozzle tips of the gas inlet nozzles within the axis are cooled and the heat flow penetrating from outside is reduced by heat insulation. An apparatus for carrying out the process is also described.

13 Claims, 4 Drawing Figures

PROCESS FOR THE COATING OF PARTICLES FOR THE PRODUCTION OF FUEL AND/OR ABSORBING ELEMENTS FOR NUCLEAR REACTORS AND APPARATUS THEREFOR

This is a division, of application Ser. No. 805,452 filed June 10, 1977 now U.S. Pat. No. 4,271,207.

BACKGROUND OF THE INVENTION

The invention is directed to a process and apparatus for coating fuel, fertile material and/or absorber material containing particles with pyrolytic carbon and/or pyrolytic carbides by introducing thermally cleavable gases into the hot reaction space of a fluidized bed unit at temperatures above 1000° C. Such particles are inserted into fuel elements or absorber elements as fuels or as absorbers for neutron absorption, which fuel elements or absorber elements are inserted in nuclear reactors, particularly in high temperature reactors.

Fuel elements for high temperature reactors generally consist of carbon as the structural material in which there is introduced the fuel and fertile material in the form of coated particles. These coated particles are spherical small particles of carbides and/or oxides of fuel and/or fertile materials, especially of uranium and thorium, also called heavy metal kernels which are coated with layers of pyrolytic carbon, sometimes also with layers of silicon carbide (J. L. Kaae, Journal of Nuclear Materials 29 (1969), 249-266).

In a given case coated absorber particles also are introduced into the fuel elements or into particular absorber elements. The coated absorber particles have a nucleus consisting of barium carbide or other boron compounds, e.g., borides, or other absorber compounds, e.g., hafnium carbide.

The production of the coated particles generally takes place by coating the heavy metal kernels in fluidized bed units. For this purpose the kernels are heated at a high temperature in a vertically standing graphite tube which is closed at the bottom with a conical or flat shaped perforated or fritted bottom. Carrier gas, usually argon is blown in through the bottom and so the particle charge is held in motion. The cleavable gas, e.g., a hydrocarbon gas, necessary for the coating is sometimes directly blown in through holes in the bottom of the bed, but is usually introduced through water cooled nozzles consisting of a nozzle tip with an elongated inlet tube, which is fitted into the bottom of the bed. The hydrocarbon is pyrolytically decomposed in the hot fluidized layer of the heavy metal kernels whereby the carbon is deposited as a layer on the particles and the hydrogen is removed with the waste gas (P. Koss, Ber. der Deutschen Keramischen Ges. 43 (1966), No. 3, pages 239-245).

Besides hydrocarbon gases there have also been employed other thermally cleavable gases in order to deposit other materials as coating on the kernels. Thus for the production of pyrolytic silicon carbide coatings there is generally used trimethyl chlorosilane and for depositing zirconium carbide coatings, zirconium chloride is employed. These thermally cleavable gases generally are diluted with an inert gas for the production of a suitable reaction result. The inert gas simultaneously serves in the fluidized bed as the carrier gas or as a supplement to the additionally introduced carrier gas for fluidizing the fluidized bed.

Besides the introduction of coating gases through the bottom of the fluidized bed recently good coating results have also been produced by introducing the coating gases into the fluidized layer from above via a water cooled lance of nozzles (German Offenlegungsschrift No. 2 343 123 and related Huschka U.S. application Ser. No. 500,017 filed Aug. 23, 1974 and now U.S. Pat. No. 4,056,641). The entire disclosure of the Huschka U.S. application is hereby incorporated by reference and relied upon.

In order to guarantee a trouble-free progress of the coating process the coating gas must be introduced into the fluidized bed below its decomposition temperature, since otherwise the gas inlet openings quickly clog up. The coating temperature in the fluidized bed is above 1000° C., usually at about 1200° to 2000° C., and the gas inlet nozzle is in direct thermal contact with the solid likewise hot bottom of the reaction tube. FIG. 1 shows an illustrative form of such a prior art water cooled gas inlet nozzle. As a rule the gas inlet nozzle is made of metals whose melting point is below the coating temperature. As an exception customarily there is only the nozzle tip which, e.g., is made of molybdenum.

In such a fluidized bed the gas inlet nozzles assume the following functions.

They must center the reaction tube 2 with the bottom 1 in the hot tube 3, carry the weight of the reaction tube 2, the bottom 1 and the fluidized bed 4, guarantee a sufficiently tight sealing of the reaction space between the head 5 of the nozzles and the bottom 1 so that it is possible to introduce the carrier gas via the annular gap 6 in the fluidized bed 4 and the introduction of the coating gas, in a given case also the coating gas-carrier gas mixture, into the hot fluidized bed without inadmissably high heating of the coating gas, which depends on a sufficient removal of contact and radiation heat.

Furthermore, such gas inlet nozzles generally have an inner gas inlet tube 8 for the coating gas which is surrounded by the carrier gas inlet tube whose outer surface is cooled with the help of the conduit pipe 10 for the cooling water. Externally the gas inlet nozzle is closed by the metal outer jacket 9.

In the hitherto customary constructions for gas inlet nozzles these functions can be completely assumed so long as there is provision for a sufficient removal of heat. Because of the very high specific thermal loading per unit of surface between the hot reaction tube bottom and the head 5 of the nozzles it was hitherto believed a sufficient cooling could only be produced with water. The use of other cooling media had little success.

A particular danger for the previous fluidized bed furnace units, particularly for the gas inlet nozzle, is if the cooling water provision fails since the amount of heat stored in the hot furnace parts (reaction tube, bottom, hot tube, fluidized materials) is sufficient to heat the gas inlet nozzle up to the region of the melting temperature even if immediately after the failure of the cooling water the furnace heating is disconnected.

Furthermore in the production and processing of nuclear fuels, as is known, the nuclear physically permissible amounts of fissile material which can be handled in a container or apparatus of arbitrary geometry, the so-called safe amount, is greatly limited by the presence of a moderator, e.g., water. In fluidized bed furnace units with water cooled gas inlet nozzles there must always be reckoned with the danger of a water break and the flooding of the fissile material with water. Therewith, the per charge coatable amount of heavy metal kernels is limited to a specific size by the water cooling, which in the previously stated geometry by the coating process otherwise is only dependent on the type and composition of the heavy metal.

To avoid this limitation it has recently been proposed to employ in place of water as the fluid cooling medium carbon compounds containing chlorine and fluorine which are used many times in cooling and climate control. However, these materials are basically poorer heat conductors than water and have the disadvantage that they are thermally decomposed to a certain extent at the high temperature present. A further disadvantage is that these materials form decomposition products because of the impossibility of entirely excluding leakage in the hot reaction space, which act corrosively on the apparatus parts located in the waste gas tract. The danger of corrosion is particularly injurious in units in which fuels and fuel elements are produced in a reprocessing plant operated at a distance from the fissionable fuel in a high temperature reactor and obtained from fertile material and subsequently worked up, since in such a plant all maintenance operations are very difficult and expensive. In reprocessing plants there is the additional disadvantage that the chlorine-fluorine containing cooling media also decomposes by the radioactive radiation of the fluidized material.

Therefore, it was the problem of the invention to coat particles for the production of fuel elements and/or absorber elements for nuclear reactors by introducing thermally cleavable gases without their premature decomposition into the hot reaction space i.e., about 1000° C., of a fluidized bed unit with the help of a gas inlet nozzle cooled with a cooling medium and having an elongated inlet tube without cooling which prevents a premature decomposition of the gases bringing with it a substantial limitation on the amount of fuel kernels added because of the nuclear physically safe conditions or the danger of a corrosive effect by the cooling medium or its decomposition products.

SUMMARY OF THE INVENTION

This problem was solved according to the invention by making the cooling medium exclusively gaseous and by cooling only the portion of the inlet tube for the nozzle tips of the gas inlet nozzles and reducing the heat flow penetrating from outside by heat insulation.

It is particularly advantageous that the carrier gas led in is used simultaneously as cooling medium.

To carry out the process of the invention there is advantageously employed an apparatus which consists of a fluidized bed unit connected to a gas inlet nozzle and is characterized by the outer tube of the gas inlet nozzle being prepared of a heat resistant material with a melting point above the operating temperature of the unit and by an insulating coating from the cooling medium flowing through.

The invention will be understood best in connection with the drawings wherein:

As previously explained, FIG. 1 shows a prior art apparatus;

Figure 1:
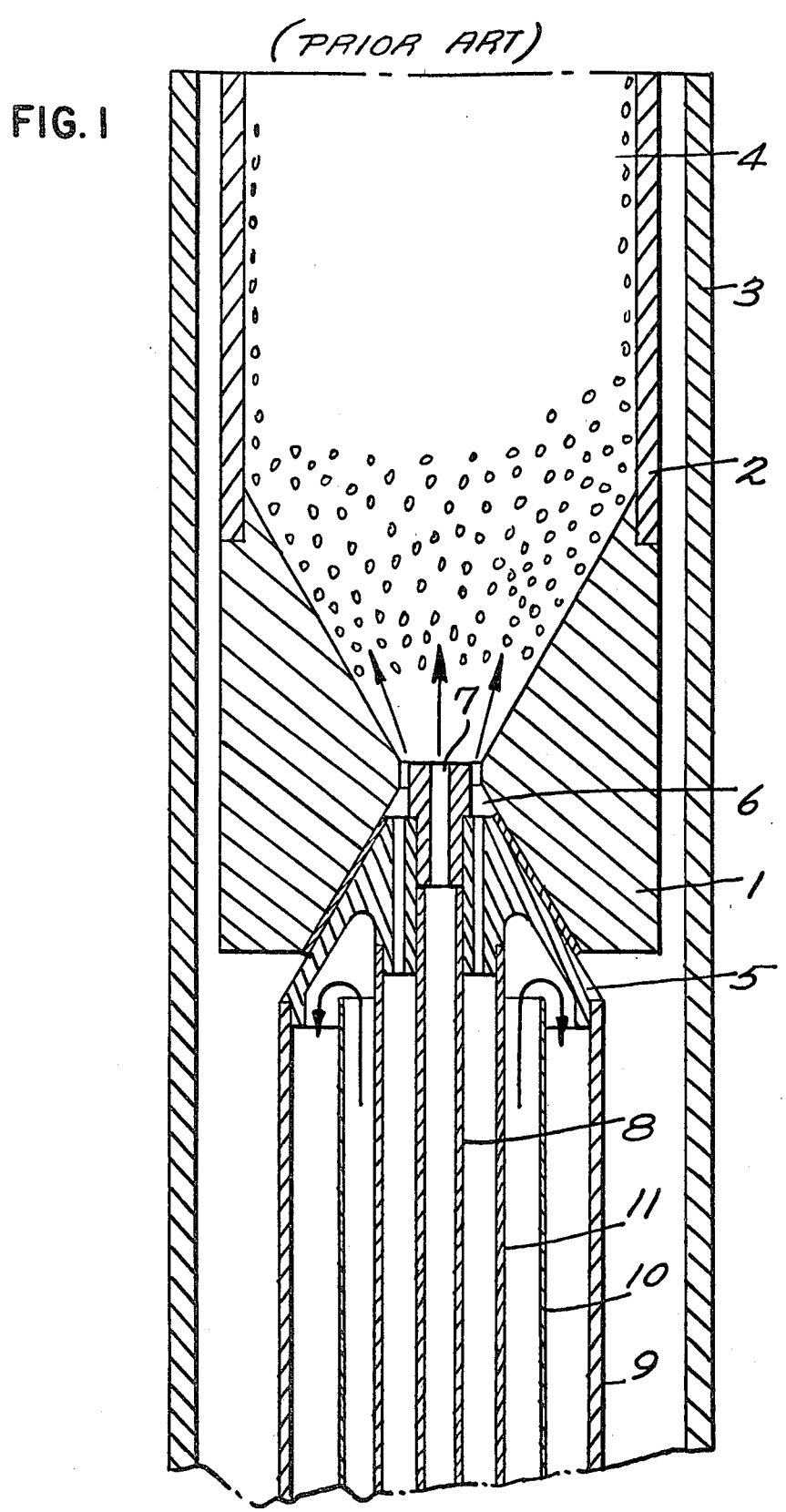
Figure 2:
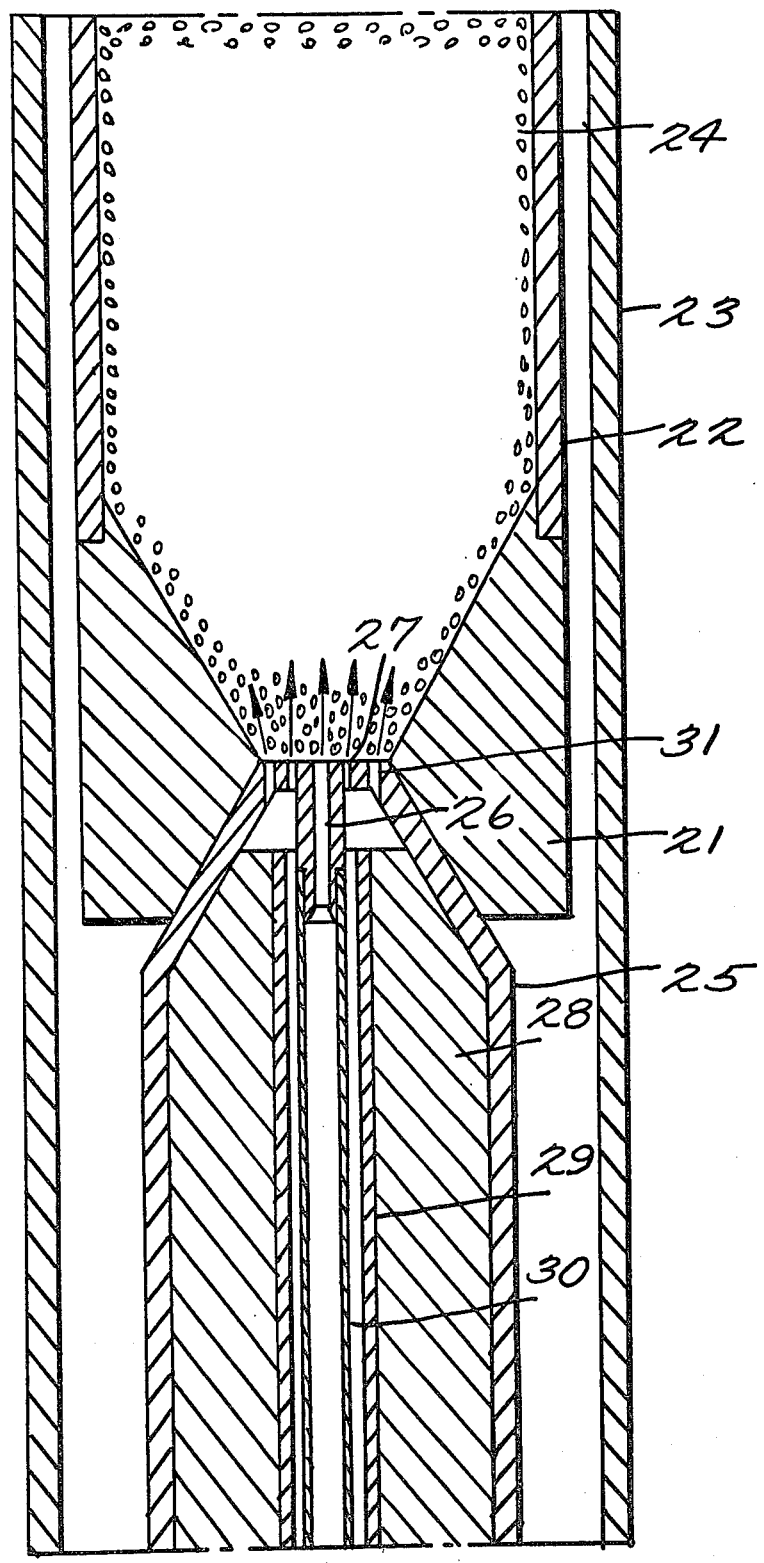
FIG. 2 illustrates schematically one apparatus useful in the invention.

Referring more specifically to FIG. 2, it shows a gas cooled gas inlet nozzle. It is particularly characterized by a heat resistant outer tube 25, e.g., of graphite, which has the function of centering the reaction tube 22 with the bottom 21 in the hot tube 23, carrying the weight of reaction tube 22, bottom 21 and fluidized bed 24 as well as sealing off the reaction space sufficiently tightly.

The carrier gas is introduced through an annular gap and through additional bores 31 in the top portion of outer tube 25 in the hot fluidized bed, the coating gas flows through the heat resistant nozzle tip 26 into the reaction space. The function of leading carrier gas and coating gas is supplied by two concentrically arranged gas conduit tubes 29 and 30 which are separated from the hot outer tube 25 by a high quality insulation 28, e.g., graphite felt. As a result the amount of carrier gas flowing through the annular gap between the gas conduit tubes 29 and 30 is sufficient to lead off the amount of heat entering into the reaction space through the insulation 28 with the coating gas flowing through the central tube 30 being heated to the decomposition temperature.

The use of heat resistant material, e.g., graphite for the outer tube 25 and e.g., molybdenum for the nozzle tip 26 and the gas inlet tubes 29 and 30 has the advantage that in breakdown of the cooling the entire gas inlet system remains able to function. By simple measures, e.g., an electrical interlocking circuit, the introduction of coating gas can be interrupted as soon as an insufficient amount of carrier gas for cooling flows through the nozzle system. Thereby a clogging of the gas inlet system by premature decomposition of the coating gas is prevented safely.

By using a gas as the cooling medium, there can be safely avoided the danger of a water break into the fluidized bed which is present where using cooling water whereby it is possible to coat an about 10 to 20 times larger amount (safe amount) of heavy metal kernels per charge.

In the following examples there are set forth variations in the process and variations in the construction for carrying out the invention.

The term "Nm³/h" means normal cubic meters per hour, i.e., the number of meters of gas measured at standard temperature and pressure (0° C. and 760 mm).

The process can comprise, consist essentially of or consist of the steps set forth.

DESCRIPTION OF THE PREFERRED EMBODIMENTS

EXAMPLE 1

A 3 kg ThO$_2$ kernel charge with an average particle diameter of 600$\mu$ in the apparatus of the invention according to FIG. 2 was coated in a coating unit with pyrolytic carbon. The fluidized bed used had an inner diameter of the operating tube, also designated as bed diameter, of 170 mm, the gas inlet tubes 29 and 30 inner diameters of 10 mm and 4 mm respectively, the outer diameter of the outer tube 25 was 80 mm and the insulation layer of graphite felt had a layer thickness of about 25 mm. The coating took place under normal pressure. The coating parameters as well as the results produced are set forth in Table 1. There was not observed a clogging of the nozzle.

TABLE 1

| Coating Parameter | | Properties of the Layer | |
|---|---|---|---|
| Buffer Layer | | | |
| Gas flow (Nm³/h) Argon: | 3.5 | Layer thickness ($\mu$) | 92 |

TABLE 1-continued

| Coating Parameter | | Properties of the Layer | |
|---|---|---|---|
| Gas flow (Nm³/h) C₂H₂: | 3.5 | Standard deviation (μ) | 8.9 |
| Temperature (0° C.) | 1450 | Layer density (g/cm³) | 1.09 |
| Isotropic Outer Layer | | | |
| Gas flow (Nm³/h) Argon: | 3.5 | Layer thickness (μ) | 71 |
| Gas flow (Nm³/h) C₃H₆: | 2.7 | Standard deviation (μ) | 7.8 |
| Temperature (0° C.) | 1300 | Layer density (g/cm³) | 1.85 |
| | | Rate of growth (μ/min) | 4.2 |

In producing the buffer layer according to Table 1 the coating temperature was 1450° C. and 3.5 Nm³ C₂H₂ (acetylene)/h flowed through the inner gas inlet tube 29 and 3.5 Nm³ Argon/h flowed through the annular gap between tube 29 and tube 30. The heat flow through the graphite felt insulation 28 at the length of the gas conduit system of 400 mm and at a heat conductivity value of 0.3 kcal/m·h·degree under the assumption of the constant temperature of 1450° C. over the entire length of the outer tube 25 with an outer diameter of 80 mm only amounted to about 500 kcal/h which corresponds to a heating of the coating gas stream at a heat transfer number k of the system of about 0.85 kcal/m·h·degree of less than 200° C. An increase in temperature of the coating gas in the region of the nozzle tip 26 which for a length of maximally 20 mm is exposed directly to the heat radiating, about 1450° C. hot outer tube 25 (residence time at a diameter of 2.5 mm being about 0.1 millisecond) is limited for want of a heat exchange surface between nozzle and coating gas to less than 100° C. The temperature of the coating gas accordingly remains in the gas inlet system far below the decomposition temperature of the coating gas which is above 750° C. In the deposition conditions entered in Table 1, the heat flows for the outer layer are less and therefore the increase in temperature is lower.

EXAMPLE 2

3 kg of ThO₂ kernels with an average particle diameter of 600μ were provided with a four layer coating in the apparatus described in Example 1 (according to FIG. 2), wherein there was set up as the third layer an SiC layer. The high density isotropic carbon layers deposited as the second and fourth layers were deposited from a hydrocarbon mixture consisting of propylene and acetylene.

The coating parameters as well as the results obtained are set forth in Table 2. Here also there was not observed any clogging of the nozzle.

TABLE 2

| Coating Parameter | | Properties of the Layer | |
|---|---|---|---|
| Buffer Layer | | | |
| Gas flow (Nm³/h) Argon: | 3.5 | Layer Thickness (μ) | 86 |
| Gas flow (Nm³/h) C₂H₂: | 3.5 | Standard deviation (μ) | 8.8 |
| Temperature (0° C.) | 1450 | Layer density (g/cm³) | 1.02 |
| Isotropic Inner Layer | | | |
| Gas flow (Nm³/h) Argon: | 3.5 | Layer thickness (μ) | 39 |
| Gas flow (Nm³/h) C₃H₆/C₂H₂: | 3.2 | Standard deviation (μ) | 4.3 |
| Temperature (0° C.) | 1300 | Layer density (g/cm³) | 1.86 |
| Volume ratio C₃H₆:C₂H₂ | 46.54 | Rate of growth (μ/min) | 4.4 |
| SiC Layer | | | |
| Gas flow (Nm³/h) H₂: (main stream) | 8.5 | Layer thickness (μ) | 28 |
| Gas flow (Nm³/h) H₂/Silane: (secondary stream) | 1.0 | Standard deviation (μ) | 2.0 |
| Temperature (0° C.) | 1500 | Layer density (g/cm³) | 3.20 |
| Volume ratio in secondary | | Rate of growth (μ/min) | 0.4 |
| stream H₂/Silane | 93:7 | | |
| Isotropic Outer Layer | | | |
| Gas flow (Nm³/h) Argon: | 3.5 | Layer thickness (μ) | 41 |
| Gas flow (Nm³/h) C₃H₆/C₂H₂: | 3.2 | Standard deviation (μ) | 5.1 |
| Temperature (0° C.) | 1300 | Layer density (g/cm³) | 1.85 |
| Volume ratio C₃H₆:C₂H₂ | 46.54 | Rate of growth (μ/min) | 4.0 |

Further examples of the process of the invention and the apparatus of the invention are illustrated in connection with FIGS. 3 and 4.

Figure 3:
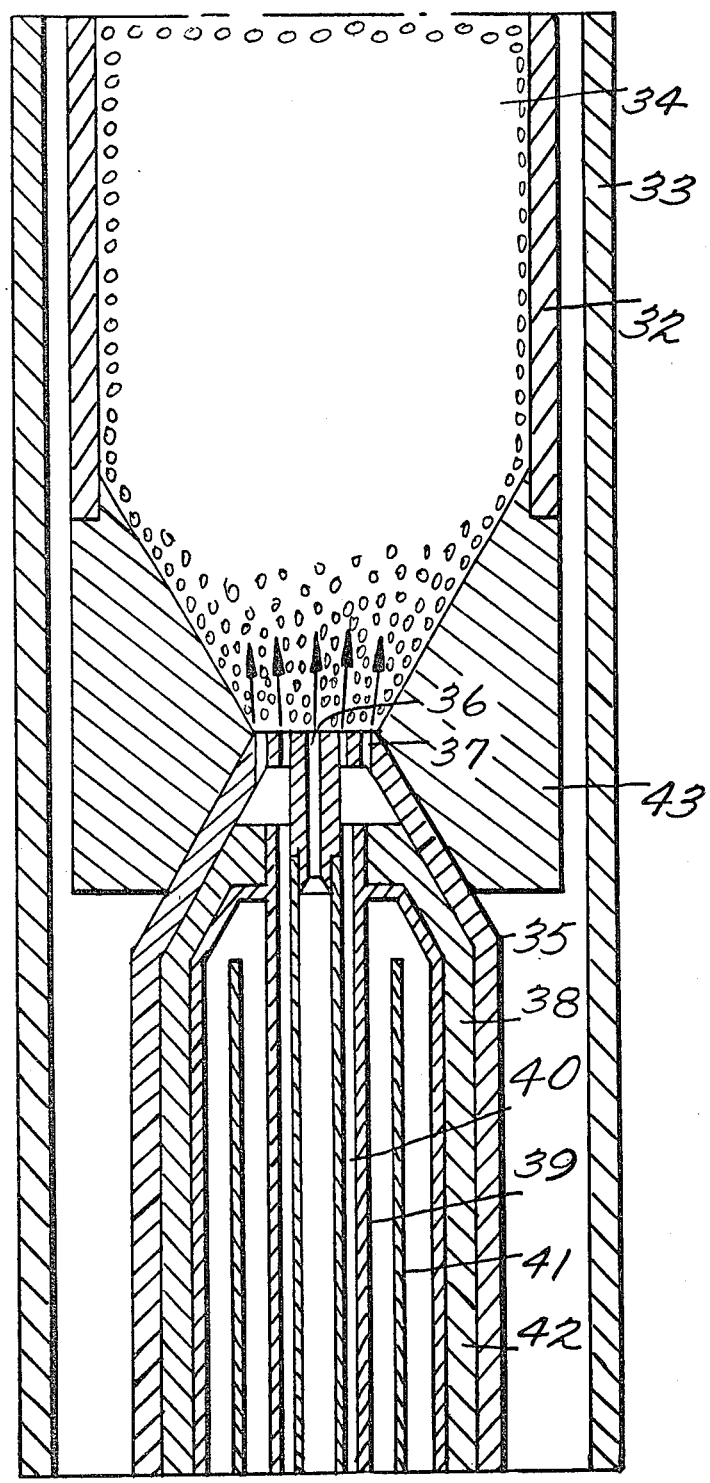
FIG. 3 illustrates in schematic fashion another apparatus useful in the invention; and, FIG. 4 illustrates in schematic fashion still another apparatus useful in the invention.

FIG. 3 shows a gas cooled gas inlet nozzle in which the carrier gas cannot be called upon to remove heat or else is insufficient.

In this apparatus the carrier gas tube 39 is surrounded by a cooling jacket tube 42 having a cooling gas conduit 41 therebetween the amount of heat passing through the insulation 38 is led off via the cooling jacket by separately connected cooling gas. The remaining parts correspond to the parts in FIG. 2. The reaction tube 32 with bottom 43 contains the fluidized bed 34 and is surrounded by hot tube 33. The heat resistant outer tube 35 in its top carries bores 37 for introducing carrier gas and the nozzle tip 36 for introducing the coating gas which is led in through the tube 40 of the nozzle tip.

As is seen in FIGS. 2 and 3, the cooling medium according to the invention can either be carrier gas which brings into the fluidized bed the heat taken on in the cooling of the insulation inner wall or there is according to FIG. 3 introduced an additional gas stream which draws off the heat from the insulation inner wall. The latter employed process variant is necessary if the amount of carrier gas led into the fluidized bed through the nozzle is too small to remove the amount of heat which occurs.

Figure 4:
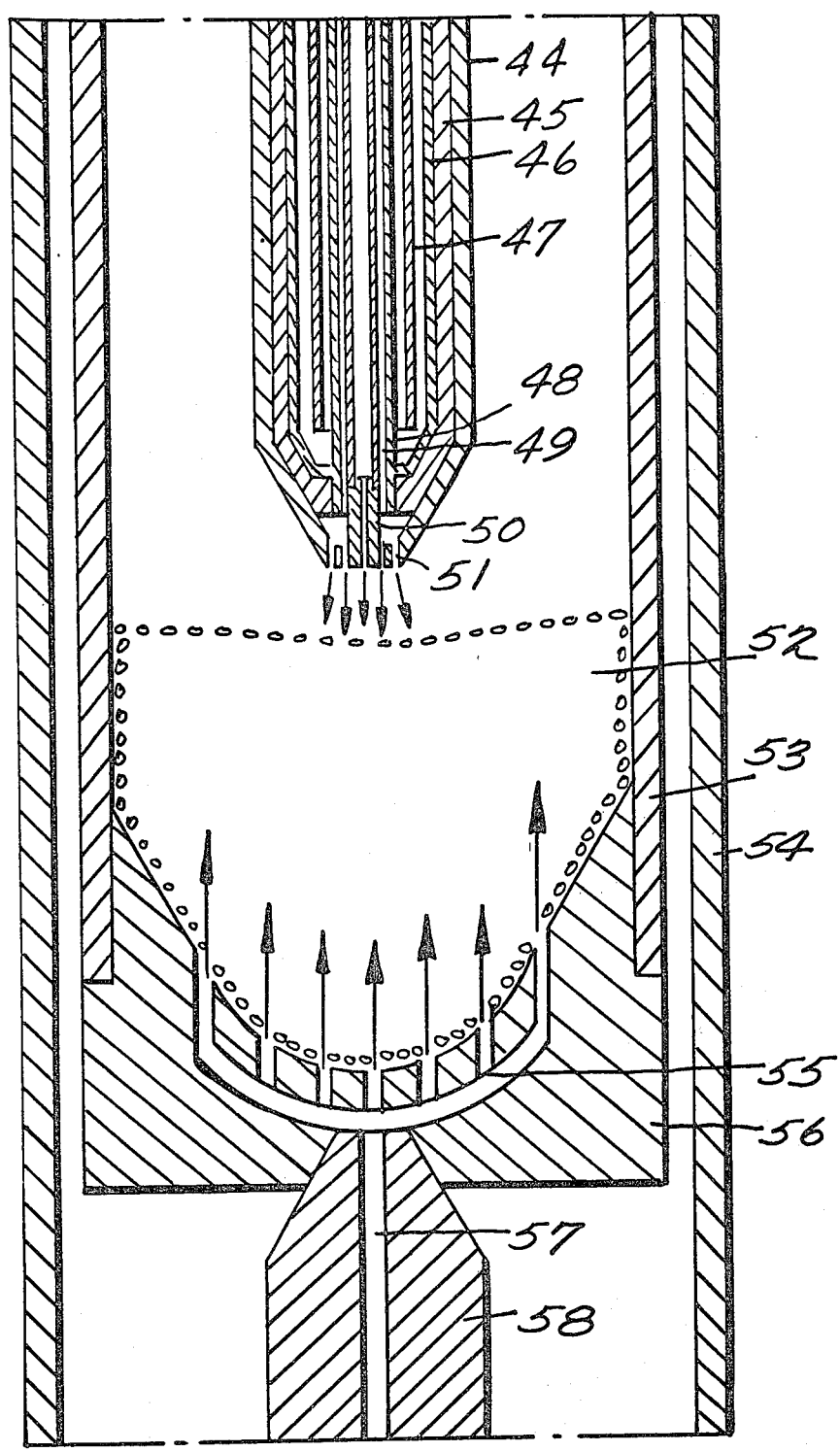

FIG. 4 shows an apparatus with a gas cooled, gas inlet nozzle immersed in the fluidized bed 53 from above. Corresponding to the apparatus of FIG. 3 it is composed of a heat resistant outer tube 44, for example made of graphite, the high quality insulation layer 45, e.g., of graphite felt, the cooling jacket tube 46, the cooling gas conduit tube 47, the carrier gas tube 48 and the inner lying coating gas tube 49 connected to nozzle tip 50 which is surrounded by the stop of the heat resistant outer tube 44 which has located in its top bores 51 through which the inert gas flowing around the nozzle tip is led into the fluidized space. The nozzle with nozzle tip 50 ends at a fixed distance, e.g., 20 mm, above the fluidized particles within the reaction tube 53 which is surrounded by the hot tube 54. The fluidized bed is closed below by the bed bottom 56 through whose bores or gaps 55 the carrier gas necessary for fluidization is led from below. The carrier gas is led to the bottom of the bed with the help of heat resistant tube 58 having central channel 57.

In the form of the invention illustrated by FIG. 4 the coating gases enter the fluidized bed from above in which the nozzle lance plunges a long distance into the hot reaction tube and ends closely above the fluidized layer, the coating gas in leaving the nozzle tip is only flowed around by a small amount of inert gas in order to avoid clogging of the nozzle tip while the carrier gas is led into the fluidized bed from below. Here also the carrier gas, before it is introduced from below into the fluidized bed can be led as cooling gas through the above gas inlet nozzles located in the bed and heated thereby.

As carrier gas there is generally used argon or helium. In special cases hydrogen can also be used either alone or as a mixture with argon or helium. To avoid corrosive effects the cooling gas used in a given case in addition to the carrier gas must be an inert gas, i.e., it cannot contain oxygen or an oxygen containing compound. Preferably argon or helium is used but other noble gases or oxygen free nitrogen can also be employed.

In order to reduce the operating expense the amount of cooling gas, which in a given case is necessary in addition to the carrier gas, can be recycled over a water fed cooling aggregate by pumping.

In place of thorium oxide the process of the invention can also be employed, for example, to coat uranium oxide, thorium carbide, uranium carbide, plutonium oxide, plutonium carbide, boron carbide, boronated graphite, hafnium carbide, gadolinium oxide, samarium oxide, europium oxide or mixtures thereof.

What is claimed is:

1. An apparatus suitable for use in a process of coating particles of fuel, fertile material, absorber material or mixtures thereof which can be employed in nuclear reactors, in which process thermally cleavable gases are introduced into a reaction space heated to an operating temperature of a fluidized bed unit provided with a gas inlet nozzle having an elongated inlet tube and cooled with a cooling medium, the cleavable gases are decomposed after leaving said nozzle and the decomposition products are deposited on said fuel, fertile material or absorber particles present in the fluidized bed, and the cooling medium employed is solely gaseous, said apparatus comprising, in said reaction space of said fluidized bed unit, inlet nozzle means for introducing said cleavable gas into said reaction space, said nozzle means including an outer tube having an axis, an inner tube disposed radially within said outer tube for carrying the cleavable gas, said inner tube having a nozzle tip with said tip having one end exposed to said reaction space and its other end spaced a distance therefrom, a cooling tube also disposed radially within said outer tube and surrounding said inner tube and having an end terminating at a cooling chamber, said cooling chamber surrounding at least a portion of said nozzle tip so that, when a cooling gas is passed through said cooling tube, said portion will be exposed to said cooling gas to cool said nozzle tip, an insulating layer disposed radially between said outer tube and said cooling tube, said outer tube being made of a heat-resistant material with a melting point above the operating temperature of said unit.

2. The apparatus as claimed in claim 1 wherein there is provided a cooling jacket between said cooling tube and said insulating layer.

3. The apparatus of claim 2 consisting essentially of the stated elements.

4. The apparatus of claim 1 consisting essentially of the stated elements.

5. In apparatus for coating heavy metal particulate kernals of fuel, fertile material and/or absorber material with pyrolytic carbon and/or pyrolytic carbides, which includes:
   a vertically standing hot tube containing wall means defining a fluidized bed reaction chamber for enclosing a charge of heavy metal kernals as a stream of thermally cleavable gas and a stream of bed-fluidizing carrier gas are introduced into the chamber while the chamber is maintained at an operating temperature, above 1000° C., sufficient to pyrolytically decompose said cleavable gas,
   an improvement in inlet nozzle cooling which permits the coating in said chamber of a greater mass of said particulate kernals per unit time than would be a so-called safe amount were said particulate kernals composed of fissile material and were water used as an inlet nozzle coolant, and which avoids the reaction chamber waste gas tract corrosion which would result were carbon compounds containing chlorine and/or fluorine used as an inlet nozzle coolant,
said improvement comprising:
   means defining a vertically directed opening through said fluidized bed reaction chamber wall means;
   a vertically directed inlet nozzle extending within said hot tube and sealingly fitted into said opening so as to permit the introduction of said stream of thermally cleavable gas into said chamber through a tip end portion of said nozzle;
   said nozzle including:
      a jacketing outer tube of heat resistant material such as graphite;
      a coating gas inlet tube enclosed by said outer tube and terminating in a nozzle tip opening through said outer tube into said chamber, said nozzle tip being made of a heat resistant material having a melting temperature that is above said operating temperature, for introducing said thermally cleavable carrier gas into said chamber;
      tubular wall means within said outer tube defining an annular cooling gas passage surrounding said coating gas inlet tube, said tubular wall means terminating within said tip end portion of said nozzle;
      means defining at least one opening through said outer tube at said tip end portion of said nozzle, between said nozzle tip and said reaction chamber wall means, said opening means being in communication with said annular cooling gas passage within said tip end portion of said nozzle so that a stream of cooling gas may flow along said passage and through said opening means and into said reaction chamber thus providing at least part of a means for fluidizing said charge of heavy metal kernals; and a tubular body of thermal insulation surrounding said tubular wall means of said annular cooling gas passage and being surrounded by said outer tube;
   said nozzle being characterized by the absence of cooling water passage means and by the absence of cooling chloro/fluoro carbon passage means, and by the situation that at a given flow rate substantially all of what prevents the thermally cleavable coating gas from pyrolytically decomposing until it flows into said chamber is the combined effects of said tubular body of thermal insulation in stemming the flow of heat towards said coating gas inlet tube and of said cooling gas in carrying heat away from within said tubular body of thermal insulation and from the vicinity of said nozzle tip.

6. The apparatus improvement of claim 5, wherein:

said vertically directed opening means opens upwardly through said wall means into said reaction chamber;

said opening means through said outer tube constitutes the sole means for admitting inert fluidizing gas to the reaction chamber; and said tubular wall means is configured to direct substantially all of said cooling gas which enters said annular cooling gas passage into said reaction chamber.

7. The apparatus improvement of claim 5, wherein:

said tubular wall means includes coaxial divider wall means dividing said cooling gas passage into two coaxial annular portions, only one of which is communicated with said opening means through said outer tube with said reaction chamber and the other of which constitutes means for circulating a larger mass flow of cooling gas through the nozzle than is being admitted to the reaction chamber.

8. The apparatus improvement of claim 7, wherein:

said vertically directed opening means opens upwardly through said wall means into said reaction chamber; and said opening means through said outer tube constitutes the sole means for admitting inert fluidizing gas to the reaction chamber.

9. The apparatus improvement of claim 7, wherein:

said vertically directed opening means opens downwardly through said wall means into said reaction chamber.

10. The apparatus improvement of claim 9, further including:

upwardly opening means through said wall means into said reaction chamber for admitting an additional stream of fluidizing gas into said reaction chamber.

11. The apparatus improvement of claim 5, wherein:

said tubular body of insulation is constituted by a layer of graphite felt.

12. In apparatus for coating a charge of heavy metal kernals with pyrolytic carbon and/or carbides in a fluidized bed reaction chamber at elevated temperature of at least 1000° C., an improvement comprising:

a nozzle having a tubular tip in sealed communication with said chamber;

means defining a flow passage through said nozzle to said tubular tip;

a stream of thermally cleavable carbon-containing coating gas flowing through said passage and out of said tubular tip into said chamber at below the temperature at which any substantial proportion thereof will pyrolyse;

a cooling jacket surrounding said flow passage;

a flow of cooling gas circulating through said cooling jacket;

a sleeve of thermal insulation surrounding said cooling jacket; and an outer casing of heat resistant material surrounding said sleeve of thermal insulation;

said circulating cooling gas and said sleeve of thermal insulation jointly being of sufficient capacity to hold the temperature rise of said stream of thermally cleavable gas within said nozzle to less than 300 degrees C. without the use of cooling liquid in said nozzle.

13. The apparatus improvement of claim 12, wherein:

said cooling jacket includes wall and opening means communicating at least part of said flow of cooling gas through said nozzle with said chamber.

* * * * *